United States Patent [19]

Griesshammer

[11] 4,156,619
[45] May 29, 1979

[54] PROCESS FOR CLEANING SEMI-CONDUCTOR DISCS

[75] Inventor: Rudolf Griesshammer, Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 853,978

[22] Filed: Nov. 21, 1977

Related U.S. Application Data

[63] Continuation of Ser. No. 690,760, May 27, 1976, abandoned.

[30] Foreign Application Priority Data

Jun. 11, 1975 [DE] Fed. Rep. of Germany ....... 2526052

[51] Int. Cl.² ........................... B08B 3/08; B08B 5/00
[52] U.S. Cl. ............................................ 134/2; 134/26; 134/28; 134/30; 134/37; 134/40
[58] Field of Search ................. 134/2, 3, 26, 28, 30, 134/37, 38, 40; 51/323

[56] References Cited

U.S. PATENT DOCUMENTS

| | | | |
|---|---|---|---|
| 2,419,237 | 4/1947 | Treuting | 156/662 X |
| 3,205,555 | 9/1965 | Balde et al. | 134/28 X |
| 3,342,652 | 9/1967 | Reisman et al. | 156/662 X |
| 3,582,401 | 6/1971 | Berilla et al. | 134/38 X |
| 3,585,668 | 6/1971 | Jaccodine et al. | 15/21 D |
| 3,607,478 | 9/1971 | Henninges et al. | 134/33 X |
| 3,664,872 | 5/1972 | Frank et al. | 134/6 |
| 3,850,721 | 11/1974 | Schubert | 134/26 X |
| 3,970,471 | 7/1976 | Bankes et al. | 134/33 X |
| 3,988,256 | 10/1976 | Vandermey et al. | 134/38 X |

OTHER PUBLICATIONS

Meek et al., *J. Electrochem. Soc.*, "Silicon Surface Contamination: Polishing and Cleaning", 9-1973, pp. 1241-1242.

*Primary Examiner*—Marc L. Caroff
*Attorney, Agent, or Firm*—Allison C. Collard; Thomas M. Galgano

[57] ABSTRACT

Semi-conductor discs are cleaned, after being subjected to a polishing operation, by immersing the discs in a solution of about 30–100% by weight non-ionic or anionic surfactant and thereafter rinsing the discs with water.

6 Claims, No Drawings

PROCESS FOR CLEANING SEMI-CONDUCTOR DISCS

This is a continuation of application Ser. No. 690,760, filed May 27, 1976, now abandoned.

The present invention relates to a process for cleaning polished semi-conductor discs, especially silicon discs.

Semi-conductor discs are obtained from monocrystalline semi-conductor rods by sawing the rods into sections. The discs are then attached to polishing plates with, for example, beeswax, a synthetic wax or another adhesive and polished using a polishing agent.The polished discs are contaminated with the adhesive, traces of the polishing agent, and with other impurities. Since even small amounts of impurities can cause considerable variation of the electrical parameters of the finished structural elements, the discs have to be thoroughly cleaned to remove these impurities.

The cleaning of the polished discs is usually effected in two successive essentially different operations: first, a washing operation involving dissolution and rinsing operations and, secondly, a mechanical cleaning operation to remove the last traces of impurities from the disc surface.

The washing step, as generally carried out, involves a number of separate operations. The wax, cement or other adhesive remains are first removed by dissolution in trichloroethylene, suitably in an ultrasonic tank or a steam vessel. The discs are then washed with acetone to remove any remaining trichloroethylene, after which they are rinsed with water. They are then immersed in concentrated nitric acid and again rinsed with water. The discs are usually then immersed in hydrofluoric acid so as to render their surfaces hydrophobic, and once more rinsed with water. There then follows the mechanical cleaning stage, consisting mostly of wiping or rubbing with suitable rags.

It is apparent that the washing operation is complicated, time-consuming, and expensive. It was therefore the object of the invention to provide an effective, but less complicated, method of carrying out the washing step.

According to the invention, a method of cleaning a polished semi-conductor disc is provided, which comprises washing the disc with an anionic or non-ionic surfactant.

The washed discs may be rendered hydrophobic and subjected to a conventional mechanical cleaning step.

Suitable anionic surfactants for use in the present method are, for example, salts of long-chain carboxylic acids, sulphuric acid esters, (e.g. alkyl sulphonates and alkylaryl sulphonates), and various fluorinated substances. Preferably, non-ionic surfactants are used, for example, various ethylene oxide addition compounds (e.g. nonylphenol polyglycol ethers or oxethylated polypropylene glycols), fatty acid monoglycerides, carbohydrate fatty acid esters (e.g. saccharose monofatty acids), non-ionic fluorohydrocarbons, and non-ionic derivatives of ethylene diamine.

The surfactants according to the invention are generally used in solutions containing from 30% to 100% by weight, preferably 80% to 100% by weight of the surfactant based on the weight of the solution. When solid surfactants are used in undiluted form, it is advantageous to heat them to a temperature above their melting point. As solvents for the solutions either water or organic solvents may be used.

The adhesive used to secure the disc to the polishing plate will normally consist of a mixture of substances of differing solubilities, and therefore the solvent of the surfactant solution used generally dissolve only part of the adhesive in order to effect cleaning. Thus it is possible to use a wide range of solvents. Polar solvents are preferred, but non-polar solvents may be used. Examples of suitable polar solvents are alcohols, esters (e.g. ethyl acetate) and ketones; and examples of non-polar solvents are hydrocarbons (e.g. benzene, xylene and hexane) and halogenohydrocarbon (e.g. trichloroethylene and perchlorohydrocarbons).

The method of the invention is suitably carried out by immersing the polished semi-conductor disc to be cleaned in the surfactant solution, preferably for a period of from about 3 to 8 minutes. Advantageously, the surfactant solution should be at a temperature above the melting point to the adhesive adhering to the disc from the preceding polishing process. Suitably, the surfactant is at a temperature within the range of from about 20° to 80° C., preferably from 50° to 60° C. The disc will then be rinsed with high purity water, for example, osmosis water, whereby the impurities are removed from the surfaces of the disc as a result of the outstanding washing action of the surfactant.

The disc is then treated so as to render it hydrophobic. This may be effected by treating it with an aqueous solution of a cationic surfactant, or by treating it with hydrofluoric acid. The aqueous solution suitably contains from 0.3 to 5%, preferably from 0.8 to 1.5%, by weight of the cationic surfactant based on the weight of the solution. Suitable cationic surfactants are, for example, amine salts, quaternary ammonium salts, and fluorine-containing surfactants based on fluorohydrocarbons, or amphoteric surfactants according to their partly cationic character.

After the washing step and, optionally, the treatment to render it hydrophobic, the disc may be subjected to a conventional mechanical cleaning operation to free it of any remaining impurities. This may be effected by wiping or rubbing it with a suitable material, for example, moistened shreds of material or muslin. The disc may then again be rinsed with high purity water and any remaining drops of water may be removed by centrifugation. The resulting cleaned and polished semi-conductor disc does not show any dirt on its surface even when examined under a beam of focused light.

An alternative method for effecting the second cleaning step, instead of by polishing the disc as described above, is to immerse a stack of discs in an aqueous solution of from 0.5 to 1.5% by weight, based on the weight of the solution of from 0.5 to 1.5% by weight, based on the weight of the solution, of an anionic or non-ionic surfactant through which solution air is blown. The air blown through the solution causes the formation of foam bubbles, which remove the last traces of dirt and leave the disc surfaces clean. The discs may be removed from the solution after a few minutes and rinsed with high purity water and centrifuged, for removal of the last drops.

The method of the invention may, in principle, be used for cleaning discs of any semiconductor material, for example, III–V compounds (e.g. gallium arsenide or germanium) and is particularly for the cleaning of silicon discs. The quality of discs cleaned according to the present method is definitely superior to that of discs cleaned according to the conventional method outlined above.

The following examples illustrate the method of the invention.

EXAMPLE 1

Nonylphenol polyglycol ether was heated in a metal tank to approximately 55° C. and kept moving by means of a circulating pump. Polished silicon discs to be cleaned were immersed for 5 minutes in this bath, subsequently removed and rinsed with osmosis water having a temperature of approximately 55° C.

The silicon discs were then briefly immersed in a bath of hydrofluoric acid in order to render their surfaces hydrophobic. Subsequently, they were again rinsed with osmosis water.

The silicon discs were then mechanically cleaned by rubbing them individually by hand with moistened muslin. They were again rinsed with osmosis water, the remains of which were centrifuged off on a centrifuging plate or whirler to which the discs were held by suction cups.

No impurities whatever could be seen on the polished silicon discs when they were examined in a darkened room under a focused light beam.

EXAMPLE 2

A washing solution containing 75% by weight of nonylphenol polyglycol ether in acetoacetic ester was kept moving in a metal tank by means of a circulating pump. Polished silicon discs to be cleaned were immersed for 5 minutes in this bath at room temperature, and subsequently removed and rinsed with osmosis water.

To render the disc surfaces hydrophobic, the discs were then immersed, for a few minutes, in a bath of a 1% by weight aqueous solution of dimethylbenzyl-dodecylammonium chloride, and subsequently rinsed with osmosis water of highest purity.

In the next step, the silicon discs were immersed in a bath of a 1% by weight aqueous solution of nonylphenol polyglycol ether. Air was blown into the washing solution, under slight excess pressure, through a tube provided with slots, in the bottom of the tank. After 5 more minutes, the discs were removed and rinsed with osmosis water, the remains of which were centrifuged off on a centrifuging plate.

The polished silicon discs were absolutely clean, so that no impurities could be seen on the polished silicon discs even when they were examined in a darkened room under a focused light beam.

From the foregoing description, one skilled in the art can easily ascertain the essential characteristics of this invention, and without departing from the spirit and scope of the invention thereof, can make various changes and modifications of the invention to adapt it to various usages and conditions. Consequently, such changes and modifications are properly, equitably, and intended to be, within the full range of equivalence of the following claims.

What is claimed is:

1. In a process for polishing and cleaning semiconductor discs wherein the discs are initially attached by adhesive matter to a polishing plate, polished, removed from the polishing plate and then cleaned by dissolving and rinsing operations to remove the adhesive matter remaining on the discs, the improvement consisting essentially of directly following removal of said discs from said polishing plate, performing said dissolving operation by immersing the polished semiconductor discs in a circulating bath of a solution of non-ionic or anionic surfactants wherein the amount of surfactant ranges from about 30 to 100% by weight, based upon the weight of the solution, said bath being maintained at a temperature ranging from 20° to 80° C. and said immersing step being effected for a period of about 3 to 8 minutes and thereafter performing said rinsing operation by rinsing said discs with water of the highest purity, said dissolving and rinsing operations resulting in removal of said adhesive matter and impurities from said polished discs.

2. The method of claim 1, wherein the surfactant is a member of the group consisting of a salt of a long-chain carboxylic acid, a sulphuric acid ester, an anionic fluorine-containing surfactant, an ethylene oxide addition compounds, a fatty acid monoglyceride, a carbohydrate fatty acid ester, a non-ionic fluorohydrocarbon, and a non-ionic ethylene diamine derivative.

3. The process according to claim 1, wherein following said initial immersing step and said rinsing step, said discs are immersed in a bath of a solution which imparts water repellancy to said discs.

4. The process according to claim 3, wherein said water-repellancy imparting-solution comprises an aqueous solution of a cationic surfactant amounting to 0.3-5% by weight, based on the weight of the solution.

5. The process according to claim 3, wherein said water-repellency imparting-solution comprises a solution of hydrofluoric acid.

6. In a process for polishing and cleaning semi-conductor discs wherein the discs are initially attached by adhesive matter to a polishing plate, polished, removed from the polishing plate and then cleaned by dissolving and rinsing operations to remove the adhesive matter remaining on the discs, the improvement comprising:

directly following removal of said discs from said polishing plate, performing said dissolving operation by initially immersing the polished semi-conductor discs in a circulating bath of a solution of non-ionic or anionic surfactants, wherein the amount of surfactant ranges from about 30 to 100% by weight, based upon the weight of the solution, said bath being maintained at a temperature ranging from 20° to 80° C. and said immersing step being effected for a period of about 3 to 8 minutes;

performing said rinsing operation by rinsing said discs with water of highest purity following said initial immersing step, said dissolving and rinsing operations resulting in removal of said adhesive matter and impurities from said discs; and following said initial immersing and rinsing steps, immersing said discs in a bath of a washing solution containing 0.5 to 1.5% by weight of anionic or non-ionic surfactants, through which solution, air is blown forming foam bubbles which bubbles serve to further remove impurities from the discs.

* * * * *